United States Patent
Shi et al.

(10) Patent No.: US 9,786,791 B2
(45) Date of Patent: Oct. 10, 2017

(54) THIN FILM TRANSISTOR, ARRAY SUBSTRATE AND METHOD OF MANUFACTURING THE SAME

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Gaofei Shi, Beijing (CN); Tianzhen Liu, Beijing (CN); Jie Song, Beijing (CN); Yijun Wang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/892,569

(22) PCT Filed: Jun. 25, 2015

(86) PCT No.: PCT/CN2015/082346
§ 371 (c)(1),
(2) Date: Nov. 19, 2015

(87) PCT Pub. No.: WO2016/115824
PCT Pub. Date: Jul. 28, 2016

(65) Prior Publication Data
US 2016/0359047 A1    Dec. 8, 2016

(30) Foreign Application Priority Data
Jan. 22, 2015   (CN) .......................... 2015 1 0032732

(51) Int. Cl.
*H01L 29/786*   (2006.01)
*H01L 27/12*    (2006.01)
(Continued)

(52) U.S. Cl.
CPC ...... *H01L 29/7869* (2013.01); *H01L 27/1225* (2013.01); *H01L 27/1259* (2013.01);
(Continued)

(58) Field of Classification Search
CPC ........... H01L 29/7869; H01L 29/78693; H01L 29/401; H01L 27/1225; H01L 27/1292
See application file for complete search history.

(56) References Cited

U.S. PATENT DOCUMENTS 8,884,286 B2 * 11/2014 Lee ................... H01L 29/66969
257/43
9,165,946 B1   10/2015 Chang et al.
(Continued)

FOREIGN PATENT DOCUMENTS

CN    101278404 A    10/2008
CN    101570854 A    11/2009
(Continued)

OTHER PUBLICATIONS

English Machine Translation of CN 102709236A, Feng et al., Oct. 2012, 8 pages.*
(Continued)

*Primary Examiner* — Evan Pert
(74) *Attorney, Agent, or Firm* — Kinney & Lange, P.A.

(57) ABSTRACT

The disclosed provides a thin film transistor, an array substrate, a display device and methods of manufacturing the thin film transistor and the array substrate. An active layer of the thin film transistor is formed of metallic oxide material, and a source electrode and a drain electrode of the thin film transistor both are formed of graphene or silver (Continued)

nanowire. The source electrode and the drain electrode are formed through an ink-jet printing process. Due to characteristics of graphene or silver nanowire, the manufacturing process of the thin film transistor may be simplified, the performance of the thin film transistor may be improved and the size of a channel region may be decreased. Further, an aperture ratio of the array substrate and the display device having such a thin film transistor may be increased.

15 Claims, 2 Drawing Sheets

(51) Int. Cl.
  *H01L 27/32*   (2006.01)
  *H01L 29/40*   (2006.01)
  *H01L 29/49*   (2006.01)
  *H01L 29/66*   (2006.01)

(52) U.S. Cl.
  CPC ...... *H01L 27/1292* (2013.01); *H01L 27/3262* (2013.01); *H01L 29/401* (2013.01); *H01L 29/4908* (2013.01); *H01L 29/786* (2013.01); *H01L 29/78693* (2013.01); *H01L 29/66969* (2013.01)

(56) References Cited

U.S. PATENT DOCUMENTS

| | | |
|---|---|---|
| 2009/0189148 A1 | 7/2009 | Araumi et al. |
| 2014/0077193 A1 | 3/2014 | Lee |
| 2014/0145178 A1* | 5/2014 | Lee .................. H01L 29/66969 257/43 |
| 2015/0146761 A1* | 5/2015 | Caraveo Frescas .... H01L 29/24 374/178 |
| 2015/0372235 A1* | 12/2015 | Noh ..................... H01L 51/0019 257/40 |
| 2016/0190244 A1* | 6/2016 | Lee ....................... H01L 29/778 257/29 |
| 2016/0204185 A1* | 7/2016 | Iijima ................. H01L 27/3276 257/91 |
| 2016/0365361 A1* | 12/2016 | Jiang ...................... H01L 21/77 |

FOREIGN PATENT DOCUMENTS

| | | |
|---|---|---|
| CN | 101840996 A | 9/2010 |
| CN | 102629578 A | 8/2012 |
| CN | 102709236 A | 10/2012 |
| CN | 103474475 A | 12/2013 |
| CN | 103839608 A | 6/2014 |
| CN | 103928401 A | 7/2014 |
| CN | 104576758 A | 4/2015 |

OTHER PUBLICATIONS

English Machine Translation of CN 103928401A, Jian et al., Jul. 2014, 8 pages.*

International Search Report and Written Opinion (including translation of Box V of Written Opinion) dated Aug. 25, 2015 for corresponding PCT Application No. PCT/CN2015/082346.

First Chinese Office Action, for Chinese Patent Application No. 201510032732.3, dated Jan. 18, 2017, 19 pages.

Second Chinese Office Action, for Chinese Patent Application No. 201510032732.3, dated May 8, 2017, 15 pages.

Third Chinese Office Action, for Chinese Patent Application No. 201510032732.3, dated Jul. 13, 2017, 18 pages.

* cited by examiner

THIN FILM TRANSISTOR, ARRAY SUBSTRATE AND METHOD OF MANUFACTURING THE SAME

CROSS-REFERENCE TO RELATED APPLICATION

This application is a Section 371 National Stage application of International Application No. PCT/CN2015/082346, filed on Jun. 25, 2015, entitled "Thin Film Transistor, Array Substrate and Method of Manufacturing the same", which has not yet published, which claims priority to Chinese Application No. 201510032732.3, filed on Jan. 22, 2015, incorporated herein by reference in their entirety.

BACKGROUND OF THE INVENTION

Field of the Invention

Embodiments of the present invention relate to a display device, in particular, to a thin film transistor, an array substrate, a display device, and methods of manufacturing the thin film transistor and the array substrate.

Description of the Related Art

A thin film transistor is used as a switching element in a flat-panel display device such as liquid crystal display (LCD), organic light emitting diode (OLED) display, active matrix organic light emitting diode (AMOLED) display and the like. For example, in a common LCD, a channel layer of TFT is mainly formed of amorphous silicon layer, which has a low mobility. As the display becomes larger, resolution and high-frequency driving performance of the display are increasingly demanded, the mobility of the channel layer of TFT is thus needed to be increased.

Currently, it has been developed to use a metallic oxide, such as Ga—In—Zn—O (IGZO) film, as an active layer of TFT. The metallic oxide has a mobility which is dozens of times that of the amorphous silicon layer and exhibits an excellent semiconductor characteristic, so that charge and discharge rates of a pixel electrode by the TFT may be greatly increased, thereby increasing a response speed of the pixel, realizing a faster refresh rate and increasing a line scanning rate of the pixel significantly.

The thin film transistor having the active layer formed of IGZO generally has an etching barrier layer, that is, an insulation layer is required to be deposited on the active layer after the IGZO active layer is formed, so as to protect the metallic oxide (IGZO) layer from being damaged during a subsequent etching of source and drain metal electrodes, thereby improving a performance of TFT having metallic oxide IGZO. Thus, it requires an additional photolithographic process to form the etching barrier layer, increasing steps of the process of manufacturing the TFT.

SUMMARY OF THE INVENTION

Embodiments of the present invention provide a thin film transistor, an array substrate, a display device and methods of manufacturing the thin film transistor and the array substrate, which may simplify a manufacturing process of the thin film transistor, improve the performance of the thin film transistor and decrease the size of a channel region.

According to an aspect of the present invention, there is provided a thin film transistor, wherein an active layer of the thin film transistor is formed of metallic oxide material, and a source electrode and a drain electrode of the thin film transistor both are formed of graphene or silver nanowire.

In the thin film transistor according to an embodiment of the present invention, the source electrode and the drain electrode of the thin film transistor both are formed of graphene or silver nanowire through an ink-jet printing process.

In the thin film transistor according to an embodiment of the present invention, the gate electrode of the thin film transistor is also formed of graphene or silver nanowire.

According to another aspect of the present invention, there is provided an array substrate, comprising a plurality of thin film transistors according to any one of the above embodiments.

The array substrate according to an embodiment of the present invention further comprises a plurality of electrodes which are formed of the same material as the drain electrode and are integrally connected thereto.

In the array substrate according to an embodiment of the present invention, the electrode is a pixel electrode, and the array substrate further comprises: a passivation layer disposed on the pixel electrode; and a plurality of common electrodes disposed on the passivation layer.

According to another further aspect of the present invention, there is provided a method of manufacturing a thin film transistor, comprising steps of:

forming the thin film transistor on a substrate, wherein an active layer of the thin film transistor is formed of metallic oxide material, and a source electrode and a drain electrode of the thin film transistor both are formed of graphene or silver nanowire.

In the method of manufacturing a thin film transistor according to an embodiment of the present invention, the step of forming the source electrode and the drain electrode of the thin film transistor from graphene or silver nanowire comprises: forming the source electrode and the drain electrode through an ink-jet printing process.

In the method of manufacturing a thin film transistor according to an embodiment of the present invention, the step of forming the active layer of the thin film transistor from metallic oxide material comprises:

doping at least one of gallium ion, tin ion, indium ion and hafnium ion into aluminum oxide based binary metal oxides, zinc oxide based binary metal oxides or indium oxide based binary metal oxides to form the metallic oxide.

According to another further aspect of the present invention, there is provided a method of manufacturing an array substrate, comprising the method of manufacturing a thin film transistor according to any one of the above embodiments.

In the method of manufacturing an array substrate according to an embodiment of the present invention, the step of forming the source electrode and the drain electrode of the thin film transistor from graphene or silver nanowire comprises: forming the source electrode and the drain electrode through an ink-jet printing process while forming a pixel electrode connected integrally to the drain electrode.

In the method of manufacturing an array substrate according to an embodiment of the present invention, the step of forming the source electrode and the drain electrode of the thin film transistor from graphene or silver nanowire further comprises: depositing a transparent conductive layer, which comprises the source electrode, the drain electrode and a pixel electrode connected integrally to the drain electrode, through the ink-jet printing process.

In the method of manufacturing an array substrate according to an embodiment of the present invention, the step of forming the thin film transistor on the substrate comprises: forming a gate electrode of the thin film transistor and a gate line connected to the gate electrode from graphene or silver nanowire through an ink-jet printing process.

According to another further aspect of the present invention, there is provided a display device, comprising the array substrate according to any one of the above embodiments.

In the thin film transistor, the array substrate, the display device and methods of manufacturing the thin film transistor and the array substrate according to the above embodiments of the present invention, due to characteristics of graphene or silver nanowire, the manufacturing process of the thin film transistor may be simplified, the performance of the thin film transistor may be improved and the size of a channel region may be decreased. Further, an aperture ratio of the array substrate and the display device having such a thin film transistor may be increased.

BRIEF DESCRIPTION OF THE DRAWINGS

In order to make purposes, technical solutions and advantages of the present invention more apparent, the present invention will be further described in detail in conjunction with the following detailed embodiments referring to accompanying drawings, in which.

DETAILED DESCRIPTION OF PREFERRED EMBODIMENTS OF THE INVENTION

Figure 1:
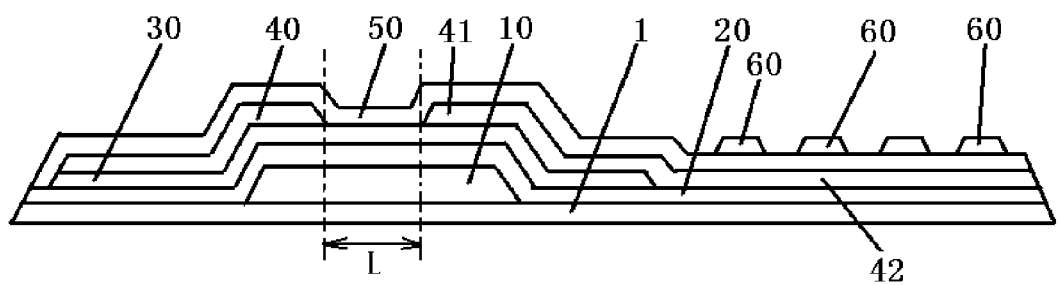
FIG. 1 is a partial cross-sectional view of an array substrate according to a first exemplary embodiment of the present invention.

The technical solutions of the present invention will be further described specifically in conjunction with the following embodiments referring to accompanying drawings. In the specification, the same or similar reference numerals indicate the same or similar parts. The following description on implementations of the present invention with reference to the accompanying drawings is intended to explain a generally inventive concept of the present invention, and should not be construed as a limitation of the present invention.

According to a generally inventive concept of the present invention, there is provided a thin film transistor. A source electrode and a drain electrode of the thin film transistor both are formed of graphene or silver nanowire through an ink-jet printing process, and an active layer of the thin film transistor is formed of metallic oxide material. Due to characteristics of graphene or silver nanowire, the source electrode and the drain electrode of the thin film transistor may be formed through the ink-jet printing process, rather than a complicated patterning process. Thus, the manufacturing process of the thin film transistor may be simplified, the performance of the thin film transistor may be improved and the size of a channel region may be decreased.

In the following detailed description, for purposes of explanation, numerous specific details are explained to provide a thorough understanding of embodiments of the present disclosure. Obviously, however, one or more embodiments without these specific details may also be implemented. In other instances, well-known structures and devices are shown in schematic diagrams so as to simplify the accompanying drawings.

FIG. 1 is a partial cross-sectional view of an array substrate according to a first exemplary embodiment of the present invention. Referring to FIG. 1, the array substrate according to the embodiment of the present invention comprises a plurality of thin film transistors. In an embodiment according to an aspect of the present invention, a source electrode 40 and a drain electrode 41 of each thin film transistor both are formed of graphene or silver nanowire (SNW), and an active layer 30 of the thin film transistor is formed of metallic oxide material.

As a kind of nano-material, graphene has excellent light transmittance and is almost completely transparent; the moving velocity of electrons in graphene far exceeds that in general conductors, and the mobility of electrons is very high at room temperature; moreover, the resistivity of graphene is very small. Silver nanowire materials have excellent light transmittance, excellent electrical conductivity as silver, and small resistivity change when being bent. In particular, graphite or a silver nanowires may be formed as a nanoscale fine particles, which can be mixed with a solvent such as deionized water, ethanol and the like to form a nano conductive ink, so that a conductive wire with small wire width may be formed through an ink-jet printing process.

Since the source electrode 40 and the drain electrode 41 both are formed of graphene or silver nanowire which has excellent electrical conductivity, excellent light transmittance, and may be formed into a conductive layer through an ink-jet printing process, it is possible to realize wire thinning and thus reduce a length of a channel region. A breakover current ($I_{on}$) of a thin film transistor may be calculated according to the following formulas:

$$I_{on} \approx \frac{1}{2}\mu C_i \frac{W}{L}(V_G - V_{th})^2$$

wherein, $\mu$ is a carrier mobility, $C_i$ is a parallel-plate capacitance per unit area, W is a width of the channel region, L is a length of the channel region, $V_G$ is a voltage applied on a gate electrode, and $V_{th}$ is a threshold voltage.

With regard to the same value of the breakover current ($I_{on}$), W will be made smaller if L becomes smaller, thereby reducing the size of the thin film transistor.

In an embodiment of the thin film transistor, the gate electrode of the thin film transistor is formed of graphene or silver nanowire (SNW) so as to improve the performance of the thin film transistor further.

In the thin film transistor according to the embodiment of the present invention, the active layer of the thin film transistor is formed of metallic oxide material, for example, indium gallium zinc oxide (IGZO) or aluminum gallium tin oxide (AGTO). By forming the active layer from metallic oxides, charge and discharge rates of pixel electrodes in pixel structures by the TFT may be increased, thereby increasing a response speed of the pixel and increasing a line scanning rate of the pixel. However, embodiments of the present invention are not limited to forming the active layer from metallic oxides. In an alternative embodiment, the active layer may be formed of polycrystalline silicon film.

According to another aspect of the present invention, as shown in FIG. 1, there is provided an array substrate, comprising a plurality of thin film transistors as described above. In a display area of the array substrate having the same size, the size of the display area may be increased as the size of the thin film transistor is reduced, so that an aperture ratio of the array substrate may be increased.

An array substrate according to another embodiment of the present invention further comprises an electrode 42 which is formed of the same material as the drain electrode 41 of the thin film transistor and is integrally connected thereto. As the electrode 42 and the drain electrode 41 are integrally connected to each other, they may be formed through the same ink-jet printing process, which further simplifies the manufacturing process and reduces manufacturing cost.

According to an embodiment of the present invention, the electrode 42 is a pixel electrode, and a pixel structure further comprises: a passivation layer 50 disposed on the pixel electrode and a common electrode 60 disposed on the passivation layer 50. For example, the pixel electrode may be a plate electrode and the common electrode may comprise a plurality of strip electrodes. In the case in which the pixel structure according to the embodiment of the present invention is applied in a liquid crystal display, an electrical field is applied between the pixel electrode 42 and the common electrode 60, so as to drive liquid crystal (not shown) above the common electrode to be deflected. In an alternative embodiment, the electrode 42 may be a polar plate of a storage capacitor. Further, in the case in which the pixel structure according to the embodiment of the present invention is applied in an OLED or AMOLED display device, the electrode 42 may be a cathode or an anode of a light-emitting assembly.

Figure 3:
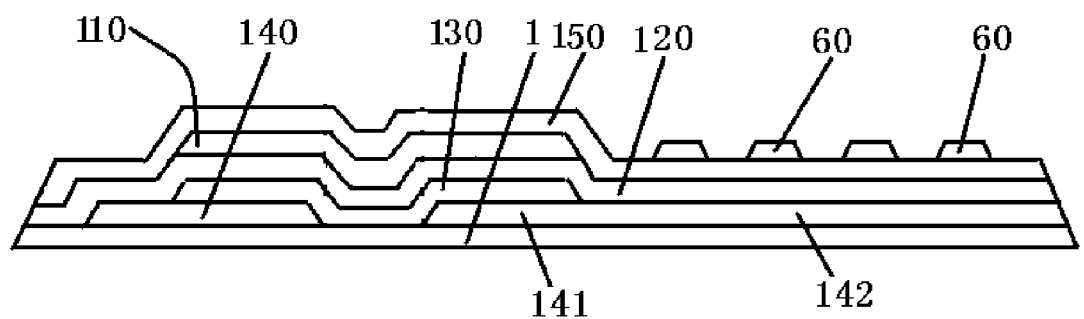
FIG. 3 is a partial cross-sectional view of an array substrate according to a second exemplary embodiment of the present invention.

In the embodiment as shown in FIG. 1, the thin film transistor is a bottom gate thin film transistor, that is, the gate electrode 10 is closer to the substrate 1 than the source electrode 40 and the drain electrode 41. In an another embodiment as shown in FIG. 3, the thin film transistor is a top gate thin film transistor, that is, the gate electrode 10 is farther from the substrate 1 than the source electrode 40 and the drain electrode 41.

According to another aspect of the present invention, there is provided a display device comprising the array substrate as described above. For example, the array substrate may be assembled with a color film substrate and then liquid crystal materials may be filled between the array substrate and the color film substrate, so as to form a liquid crystal display device. In a further embodiment, the array substrate according to the embodiment of the present invention may be applied to OLED or AMOLED display devices. These display devices may be any product or component with display function, such as mobile phones, tablet computers, televisions, monitors, notebook computers, digital picture frames, navigators, electronic paper, etc.

According to another further aspect of the present invention, as shown in FIGS. 1 and 2a-2d, there is provided a method of manufacturing a thin film transistor, comprising steps of: forming the thin film transistor on a substrate 1, wherein a source electrode 40 and a drain electrode 41 of the thin film transistor both are formed of graphene or silver nanowire, and an active layer 30 of the thin film transistor is formed of metallic oxide material. In the method of manufacturing a thin film transistor according to the embodiment of the present invention, due to characteristics of graphene or silver nanowire, the performance of the thin film transistor may be improved and the size of a channel region may be decreased, so that an aperture ratio of the array substrate having such a thin film transistor may be increased.

In an embodiment of the present invention, the step of forming the source electrode 40 and the drain electrode 41 of the thin film transistor from graphene or silver nanowire comprises: forming the source electrode and the drain electrode through an ink-jet printing process. Compared to forming the gate electrode and the source electrode through a patterning process, the number of masks for performing the patterning process may be reduced by using the ink-jet printing process. Further, during the ink-jet printing process through which the source electrode and the drain electrode are formed, the performance of the active layer formed of IGZO will not be affected, so that it is not required to provide an etching barrier layer between the active layer and the source electrode as well as the drain electrode, thereby simplifying the structure of the thin film transistor.

In the embodiment of the present invention, the step of forming the active layer 30 of the thin film transistor from metallic oxide material comprises: doping at least one of gallium ion, tin ion, indium ion and hafnium ion into aluminum oxide based binary metal oxides, zinc oxide based binary metal oxides or indium oxide based binary metal oxides to form the metallic oxide. In an exemplary embodiment, the metallic oxide may be indium gallium zinc oxide (IGZO) or aluminum gallium tin oxide (AGTO). By forming the active layer from metallic oxides, charge and discharge rates of pixel electrodes in pixel structures by the TFT may be increased, thereby increasing a response speed of the pixel and increasing a line scanning rate of the pixel.

According to another further aspect of the present invention, as shown in FIGS. 1 and 2a-2d, there is provided a method of manufacturing an array substrate, comprising a method of manufacturing the thin film transistor as described above. In a display area of the array substrate having the same size, the size of the display area may be increased as the size of the thin film transistor is reduced, so that an aperture ratio of the array substrate may be increased.

In an embodiment of the present invention, the step of forming the source electrode and the drain electrode of the thin film transistor from graphene or silver nanowire comprises: forming the source electrode 40 and the drain electrode 41 through an ink-jet printing process while forming a pixel electrode 42 connected integrally to the drain electrode 41. As the electrode 42 and the drain electrode 41 may be formed through the same ink-jet printing process, it further simplifies the manufacturing process and reduces manufacturing cost. In an exemplary embodiment, the electrode 42 is a pixel electrode.

Next, the steps of forming the array substrate on the substrate 1 will be described in detail with reference to FIGS. 1 and 2a-2d.

Figure 2A:
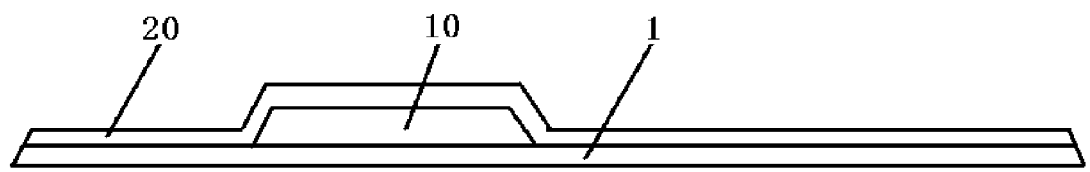
FIGS. 2a to 2d are schematic views illustrating a process of manufacturing the array substrate of FIG. 1.

Firstly, as shown in FIG. 2a, a pattern of a gate electrode 10 and its corresponding gate line (not shown) is formed on the substrate 1. Specifically, a clean substrate 1, such as a glass substrate, a transparent resin substrate or the like, is firstly prepared; then a gate electrode 10, which is generally formed of metal such as Cr, W, Ti, Ta, Mo, Al, Cu or the like and their alloys, is deposited on the substrate 1; then the gate electrode 10 and its corresponding gate line are obtained through performing a first patterning process including processes such as photoresist coating, exposure, development, etching and the like. In an alternative embodiment, the gate electrode and the gate line connected to the gate electrode are formed from graphene or silver nanowire through an ink-jet printing process, so as to improve the performance of the thin film transistor further.

Thereafter, as shown in FIG. 2a, a gate insulation layer 20 is formed on the substrate 1 formed with the pattern of the gate electrode 10 and the gate line. Specifically, the gate insulation layer 20 is deposited on the substrate 1 formed with the pattern of the gate electrode 10 and the gate line through a plasma enhanced chemical vapor deposition (PECVD) method. An oxide, nitride or oxynitride, such as a $SiO_2$ or $SiN_x$ material, may be selected to form the gate insulation layer 20, and the corresponding reaction gas may be a mixed gas of $SiH_4$, $NH_3$ and $N_2$.

Figure 2B:
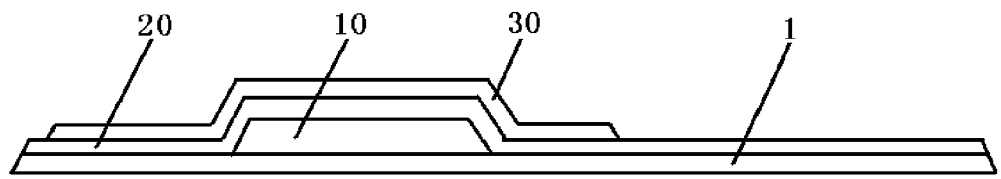

Thereafter, as shown in FIG. 2b, an active layer 30 is formed on the gate insulation layer 20 corresponding to the gate electrode 10. Specifically, a layer of IGZO metallic oxide semiconductor material is deposited on the gate insulation layer 20 corresponding to the gate electrode 10, then a second patterning process including processes such as photoresist coating, exposure, development, etching and the like is performed to obtain the active layer 30 comprising a channel region.

Figure 2C:
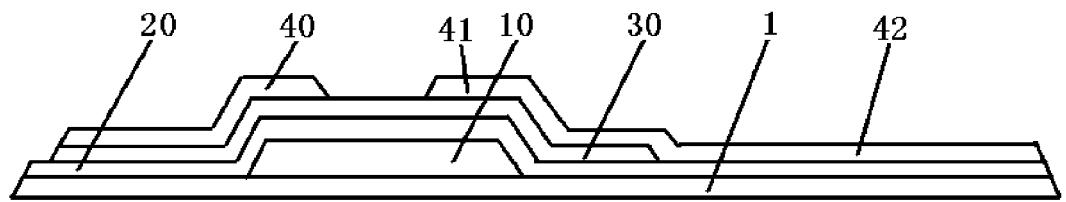

Thereafter, as shown in FIG. 2c, a source electrode 40, a drain electrode 41 and a pixel electrode 42 connected to the drain electrode 41 are formed on the active layer 30. Specifically, a transparent conductive layer, which comprises the source electrode 40, the drain electrode 41 and the pixel electrode 42 connected to the drain electrode, is deposited on the substrate 1 formed with the active layer 30 through an ink-jet printing process. In an embodiment, graphene or silver nanowires is used as a material of ink-jet printing, and graphene or silver nanowires may be formed as nanoscale fine particles. After ink-jet printing, the source electrode 40, the drain electrode 41 and the pixel electrode 42 are formed through curing process.

Figure 2D:
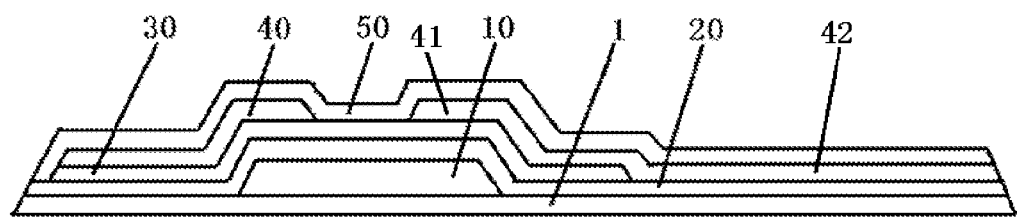

Thereafter, as shown in FIG. 2d, the source electrode 40, the drain electrode 41 and the pixel electrode 42 are covered with a passivation layer 50. Specifically, the passivation layer 50 is deposited on the substrate 1 formed with the source electrode 40, the drain electrode 41 and the pixel electrode 42 through a PECVD method. The passivation layer 50 may be formed of an oxide, nitride or oxynitride, such as a $SiO_2$ or $SiN_x$ material, and the corresponding reaction gas may be a mixed gas of $SiH_4$, $NH_3$ and $N_2$, or may be a mixed gas of $SiH_2Cl_2$, $NH_3$ and $N_2$. In an embodiment, a third patterning process including processes such as photoresist coating, exposure, development, etching and the like is performed on the passivation layer 50 to form a via hole in the passivation layer 50, for connecting electrically with a metallic layer of a source/drain electrode and a common electrode layer 60 of other thin film transistors (not shown) in surrounding circuits.

Thereafter, as shown in FIG. 2d, a common electrode 60 is formed on the passivation layer 50. Specifically, a transparent conductive layer with a thickness is deposited on the substrate 1 formed with a pattern of the passivation layer 50 through a sputtering or thermal evaporation method. The transparent conductive layer is generally formed of conductive materials such as indium tin oxide, indium zinc oxide, zinc aluminum oxide or the like. A fourth patterning process including processes such as photoresist coating, exposure, development, etching and the like is performed on the transparent conductive layer to form a common electrode 60 in a pixel area. The common electrode 60 may be formed as a plurality of strip electrodes, for applying an electrical field between the electrode 42 as a pixel electrode and the common electrode 60, so as to drive liquid crystal above the common electrode to be deflected.

In the method of manufacturing an array substrate according to the embodiment of the present invention, the source electrode, the drain electrode and the electrode are formed from graphene or silver nanowires through the ink-jet printing process. By using the ink-jet printing process to form the source electrode, the drain electrode and the electrode, it is not required to dispose an etching barrier layer between the active layer formed of IGZO and the source electrode as well as the drain electrode, so as to eliminate one patterning process and decrease some possibilities of poor contact between some conductive components, thereby improving the performance of the thin film transistor and reducing the size of the channel region.

As shown in FIG. 3, in the case in which the thin film transistor is a top gate thin film transistor, the step of forming the thin film transistor on the substrate comprises: forming a source electrode 140, a drain electrode 141 and a pixel electrode 142 connected to the drain electrode 141 on the substrate 1; forming an active layer 130 on the source electrode 140 and the drain electrode 141; forming a gate insulation layer 120 on the substrate 1 formed with the active layer 130; forming a gate electrode 110 on the gate insulation layer 120 corresponding to the active layer 130; covering the gate electrode 110 with a passivation layer 150; and forming a common electrode 60 on the passivation layer 150. In the embodiment, the gate electrode 110 is formed of graphene or silver nanowire through an ink-jet printing process.

Those skilled in the art will appreciate that materials and/or processes forming the various layers of the pixel structure shown in FIG. 3 are similar to materials and/or processes forming the respective various layers of the pixel structure shown in FIG. 1, only but the specific sequence throughout the manufacturing steps may be different, the detailed description thereof is omitted herein.

It should be noted that, since the I-V curve of the thin film transistor comprising the active layer formed of IGZO is very stable and will substantially not produce photo-induced carriers which will affect an electrical performance of the TFT when the metallic oxide semiconductor IGZO is illuminated by a light beam with a wavelength of 420 nm or more, a thin film transistor having an IGZO active layer may have a top gate configuration as shown in FIG. 3, so that a channel region of smaller length may be formed. Depending on the above formulas of breakover current, for the breakover current of the same value, the width of the channel region may be made smaller if the length of the channel region has become smaller, thereby reducing the size of the thin film transistor and increasing the aperture ratio of the pixel structure.

In the thin film transistor, the pixel structure, the array substrate, the display device and the method of manufacturing an array substrate according to the above embodiments of the present invention, it is not required to dispose an etching barrier layer between the active layer formed of IGZO and the source electrode as well as the drain electrode, so as to eliminate one patterning process, so that the manufacturing process of the thin film transistor may be simplified and the manufacturing cost may be reduced; moreover, the performance of the thin film transistor may be improved and the size of the channel region may be reduced. Thus, the aperture ratio of the pixel structure, the array substrate and the display device having such a thin film transistor may be increased, so that the display device may have a better display effect.

Though the above specific embodiments are described to explain in detail the purposes, technical solutions and advantages of the present invention further, it should be understood that the above description is only the specific embodiments of the present invention but not to limit the invention. Any modifications, equivalents, improvements which are made within the spirit and principle of the present invention should be included within the scope of the present invention.

What is claimed is:

1. A thin film transistor, wherein an active layer of the thin film transistor is formed of metallic oxide material, and a source electrode and a drain electrode of the thin film transistor both are formed of silver nanowire through an ink-jet printing process.

2. The thin film transistor of claim 1, wherein a gate electrode of the thin film transistor is also formed of silver nanowire.

3. An array substrate, comprising a plurality of thin film transistors of claim 1.

4. The array substrate of claim 3, further comprising a pixel electrode which is formed of the same material as the drain electrode and is integrally connected thereto.

5. The array substrate of claim 4, further comprising:
a passivation layer disposed on the pixel electrode; and
a common electrode disposed on the passivation layer.

6. A method of manufacturing a thin film transistor, comprising:
forming the thin film transistor on a substrate, wherein an active layer of the thin film transistor is formed of metallic oxide material, and a source electrode and a drain electrode of the thin film transistor both are formed of silver nanowire through an ink-jet printing process.

7. The method of manufacturing a thin film transistor of claim 6, wherein the step of forming the active layer of the thin film transistor from metallic oxide material comprises: doping at least one of gallium ion, tin ion, indium ion and hafnium ion into aluminum oxide based binary metal oxides, zinc oxide based binary metal oxides or indium oxide based binary metal oxides to form the metallic oxide.

8. A method of manufacturing an array substrate, comprising the method of manufacturing a thin film transistor of claim 6.

9. The method of manufacturing an array substrate of claim 8, wherein the step of forming the source electrode and the drain electrode of the thin film transistor from silver nanowire comprises: forming the source electrode and the drain electrode through an ink-jet printing process while forming a pixel electrode connected integrally to the drain electrode.

10. The method of manufacturing an array substrate of claim 8, wherein the step of forming the source electrode and the drain electrode of the thin film transistor from silver nanowire further comprises: depositing a transparent conductive layer, which comprises the source electrode, the drain electrode and a pixel electrode connected integrally to the drain electrode, through the ink-jet printing process.

11. The method of manufacturing an array substrate of claim 8, wherein the step of forming the thin film transistor on the substrate comprises: forming a gate electrode of the thin film transistor and a gate line connected to the gate electrode from silver nanowire through an ink-jet printing process.

12. A display device, comprising the array substrate of claim 3.

13. The method of manufacturing a thin film transistor of claim 6, wherein the step of forming the active layer of the thin film transistor from metallic oxide material comprises:
doping at least one of gallium ion, tin ion, indium ion and hafnium ion into aluminum oxide based binary metal oxides, zinc oxide based binary metals oxides or indium oxide based binary metal oxides to form the metallic oxide.

14. A thin film transistor, wherein an active layer of the thin film transistor is formed of metallic oxide material, and a source electrode and a drain electrode of the thin film transistor both are formed of silver nanowire through an ink-jet printing process or formed of graphene through an ink-jet printing process, and a gate electrode of the thin film transistor is formed of silver nanowire.

15. The thin film transistor of claim 1, wherein a gate electrode of the thin film transistor is formed of graphene.

* * * * *